United States Patent
Schrag

(10) Patent No.: US 10,323,387 B2
(45) Date of Patent: Jun. 18, 2019

(54) HEIGHT COMPENSATING LOADER IMPLEMENT TOOL LEVEL INDICATOR

(71) Applicant: AGCO Corporation, Duluth, GA (US)

(72) Inventor: Steven John Schrag, Hesston, KS (US)

(73) Assignee: AGCO Corporation, Duluth, GA (US)

( * ) Notice: Subject to any disclaimer, the term of this patent is extended or adjusted under 35 U.S.C. 154(b) by 0 days.

(21) Appl. No.: 15/852,378

(22) Filed: Dec. 22, 2017

(65) Prior Publication Data

US 2018/0179738 A1 Jun. 28, 2018

Related U.S. Application Data

(60) Provisional application No. 62/437,839, filed on Dec. 22, 2016.

(51) Int. Cl.
*E02F 9/26* (2006.01)
*E02F 3/42* (2006.01)
(Continued)

(52) U.S. Cl.
CPC .............. *E02F 9/26* (2013.01); *E02F 3/3405* (2013.01); *E02F 3/422* (2013.01); *E02F 9/264* (2013.01);
(Continued)

(58) Field of Classification Search
CPC ... E02F 9/26; E02F 3/34; E02F 3/3405; E02F 3/442; E02F 9/264
See application file for complete search history.

(56) References Cited

U.S. PATENT DOCUMENTS 4,970,896 A * 11/1990 Larson .................... G01F 23/48
116/228

9,783,962 B1 * 10/2017 Hitchcock ............... E02F 9/264

* cited by examiner

*Primary Examiner* — Ronald P Jarrett

(57) ABSTRACT

A bucket level indicator mechanism for use with work machine with a front mounted loader implement includes a carriage assembly having a carriage frame comprising a carriage back and first and second carriage endplates at longitudinal ends of the carriage back, a first end of the carriage assembly being pivotably connected to one of the masts, wherein the carriage back has a slot formed therein along a portion of its longitudinal length. At least one guide rod extends between the carriage endplates. A boom height compensating link is mounted on the upper arm section. The boom height compensating link has at least one fixed traveler configured to be received in the slot in the carriage back, the carriage assembly being mounted so as to slide relative the traveler, wherein as the loader boom is raised and lowered by extension or retraction of the lift actuator, the carriage assembly rotates relative the mast about a pivot as the traveler slides in the slot in the carriage back. A twisted strip extends between the carriage endplates supported by the carriage assembly configured to rotate relative the carriage endplates. A sliding indicator nut rides on the at least one guide rod such that the sliding indicator nut may move along the longitudinal axis of the carriage assembly but is prevented from rotating relative the carriage assembly, wherein the indicator nut has a center aperture that receives the twisted strip and permits longitudinal movement of the nut relative the twisted strip along an axis A of the carriage assembly, but prevents angular movement of the portion of the twisted strip that engages the nut relative to the nut, wherein the nut is driven along the axis A of the carriage assembly by a linkage that is connected relative the bucket such that the nut reflects the level position of the bucket.

6 Claims, 4 Drawing Sheets

(51) Int. Cl.
*H03M 7/30* (2006.01)
*H03M 13/00* (2006.01)
*H04L 29/06* (2006.01)
*E02F 3/34* (2006.01)
*H04W 28/06* (2009.01)

(52) U.S. Cl.
CPC ..... *H03M 7/3062* (2013.01); *H03M 13/6312* (2013.01); *H03M 13/6588* (2013.01); *H04L 69/04* (2013.01); *E02F 3/34* (2013.01); *H04W 28/06* (2013.01)

HEIGHT COMPENSATING LOADER IMPLEMENT TOOL LEVEL INDICATOR

CROSS REFERENCE TO RELATED APPLICATION

This application claims the benefit of U.S. Provisional Application No. 62/437,839 filed Dec. 22, 2016, which is hereby incorporated by reference in its entirety.

BACKGROUND OF THE INVENTION

Field of Invention

The present disclosure relates generally implements mounted on work machines, and more particularly, to implements adapted for mounting on the front of a tractor having a tool level indicator mechanism for indicating the orientation of a tool attached to the implement.

Description of Related Art

Historically, work machines such as tractors are provided with a variety of implement attachments for accomplishing different tasks. For example, it is well known to mount a loader implement to the front of a tractor having a bucket or other tool such as a pallet fork or bale spears. When operating the front loader implement from the operator station of the tractor, it can be difficult for the operator to determine whether the tool affixed to the loader implement is level or not. Thus, loader implements are commonly fitted with some means of indicating the condition of the tool.

The primary types of tool level indicators on the market today utilize a rod in a tube or a bent rod through a bracket. However, these tool level indicators have several shortcomings. The rod in a tube can only be seen as it approaches level from one direction and the bent rod through a bracket is very imprecise. Additionally, the only bucket position the loader bucket level indicators indicate is level and then only when the bucket is at ground level. Neither indicates anything but level, at one point in the loader height range, and both are hard to see. There are situations where the operator needs to know when the tool is level at points other than at ground height (e.g., with pallet forks, bale spears, etc.). Also, there are times the operator needs to know the implement position through its full range regardless of loader boom height (e.g., to keep from dumping the bucket contents onto the hood of the tractor).

Accordingly, there is a need in the art for an improved tool level indicator that overcomes the problems seen in prior art designs.

BRIEF SUMMARY OF THE INVENTION

Briefly stated, the invention is directed to a bucket level indicator mechanism for use with work machine with a front mounted loader implement. The loader implement has a loader boom moveable between a lowered position and a raised position, wherein the loader boom comprises at least one loader arm and a lift actuator configured to move the loader boom between a working range of movement between a lowered position and a raised position. The loader arm includes a forwardly projecting upper arm section and a lower arm section which extend downwardly and forwardly. The lift actuator is coupled between the mast and a junction between the upper and lower arm sections. The loader implement also has a loader bucket mounted to a distal end of the at least one loader arm with a leveling linkage and a bucket cylinder. Extension and retraction of the bucket cylinder causes the loader bucket to move between a dumping range of movement between a dump position and a rolled back position, the loader implement comprising a tool level indicator mechanism configured to provide an indication of a level position of the loader bucket in the dumping range between the dump position and the rolled back position throughout the working range of movement of the loader boom.

The bucket level indicator mechanism includes a carriage assembly having a carriage frame comprising a carriage back and first and second carriage endplates at longitudinal ends of the carriage back, a first end of the carriage assembly being pivotably connected to one of the masts, wherein the carriage back has a slot formed therein along a portion of its longitudinal length. At least one guide rod extends between the carriage endplates. A boom height compensating link is mounted on the upper arm section. The boom height compensating link has at least one fixed traveler configured to be received in the slot in the carriage back, the carriage assembly being mounted so as to slide relative the traveler, wherein as the loader boom is raised and lowered by extension or retraction of the lift actuator, the carriage assembly rotates relative the mast about a pivot as the traveler slides in the slot in the carriage back. A twisted strip extends between the carriage endplates supported by the carriage assembly configured to rotate relative the carriage endplates. A sliding indicator nut rides on the at least one guide rod such that the sliding indicator nut may move along the longitudinal axis of the carriage assembly but is prevented from rotating relative the carriage assembly, wherein the indicator nut has a center aperture that receives the twisted strip and permits longitudinal movement of the nut relative the twisted strip along an axis A of the carriage assembly, but prevents angular movement of the portion of the twisted strip that engages the nut relative to the nut, wherein the nut is driven along the axis A of the carriage assembly by a linkage that is connected relative the bucket such that the nut reflects the level position of the bucket.

This summary is provided to introduce concepts in simplified form that are further described below in the Description of Preferred Embodiments. This summary is not intended to identify key features or essential features of the disclosed or claimed subject matter and is not intended to describe each disclosed embodiment or every implementation of the disclosed or claimed subject matter. Specifically, features disclosed herein with respect to one embodiment may be equally applicable to another. Further, this summary is not intended to be used as an aid in determining the scope of the claimed subject matter. Many other novel advantages, features, and relationships will become apparent as this description proceeds. The figures and the description that follow more particularly exemplify illustrative embodiments.

BRIEF DESCRIPTION OF THE DRAWINGS

The above mentioned and other features of this invention will become more apparent and the invention itself will be better understood by reference to the following description of embodiments of the invention taken in conjunction with the accompanying drawings, wherein.

Corresponding reference characters indicate corresponding parts throughout the views of the drawings.

DESCRIPTION OF PREFERRED EMBODIMENTS

Figure 1:
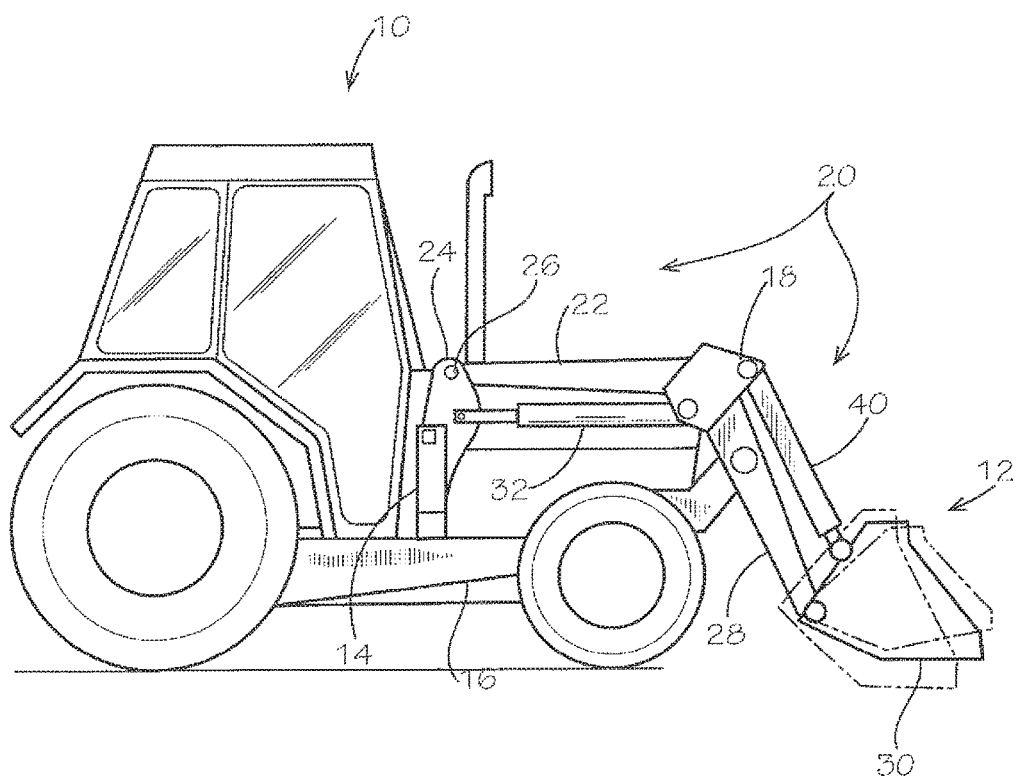
FIG. 1 is a side view of a prior art tractor with a loader implement.

The following detailed description illustrates the invention by way of example and not by way of limitation. This description will clearly enable one skilled in the art to make and use the invention, and describes several embodiments, adaptations, variations, alternatives and uses of the invention, including what we presently believe is the best mode of carrying out the invention. Additionally, it is to be understood that the invention is not limited in its application to the details of construction and the arrangements of components set forth in the following description or illustrated in the drawings. The invention is capable of other embodiments and of being practiced or being carried out in various ways. Also, it is to be understood that the phraseology and terminology used herein is for the purpose of description and should not be regarded as limiting.

FIG. 1 illustrates a work machine in the form of a tractor 10 with a front mounted loader implement 12. As shown the tractor 10 is provided with a pair of mounting frames 14 (only one of which is shown) which are bolted or otherwise affixed to a frame 16 of the tractor 10. The loader implement 12 includes a loader boom 18 moveable between a lowered position as shown in FIG. 1 and a raised position. While the tool shown in the illustrated embodiment and described herein is a bucket, one skilled in the art will understand that the invention also pertains to other tools that require an indication of the level position of the tool such as pallet loaders and bale spears. The loader boom 18 includes transversely spaced, right and left, parallel loader arms 20. The loader arms 20 include forwardly projecting upper arm sections 22 that have rear ends respectively pivotally mounted to right and left masts 24 at connection pins 26. Forward ends of the right and left upper arm sections 22 extend forwardly and are respectively coupled to upper ends of lower arm sections 28, which extend downwardly and forwardly so as to define an angle with the upper arm sections 22. Coupled between the mast 24 and the junction between the upper and lower arm sections 22 and 28, respectively, is a lift actuator 32. While the illustrated embodiment shows a loader boom 18 with upper and lower arm sections 22 and 28 of the loader arms 20 as separate components connected with a bell crank, one skilled in the art will understand that the upper and lower arm sections 22, 28 may be part of a curved loader arm 20 formed of a single component instead of two-piece as described.

Mounted to a lower front location of the lower arm sections 28 is a tool 30, such as the loader bucket shown in FIG. 1. The bucket 30 extends transversely and has transversely spaced mounting hooks (not shown), at its back side for receiving coupling pin portions of a carrier and latching device 34. Extension and retraction of a bucket cylinder 40 serves to roll the tool 30 between dump and rolled back positions. The loader 12 described thus far is conventional in its configuration and other means for supporting and moving a tool such as a loader bucket may be used using sound engineering judgment.

Figure 2:
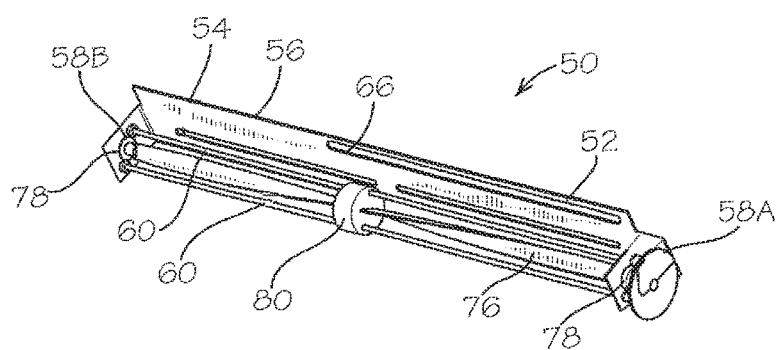
FIG. 2 is a perspective view of a tool level indicator mechanism according to an embodiment of the invention.
Figure 3:
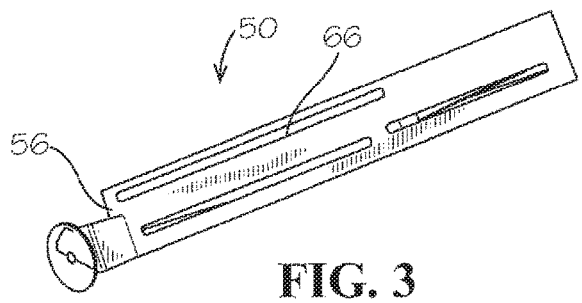
FIG. 3 is a rear perspective view of the tool level indicator mechanism of FIG. 2.
Figure 4:
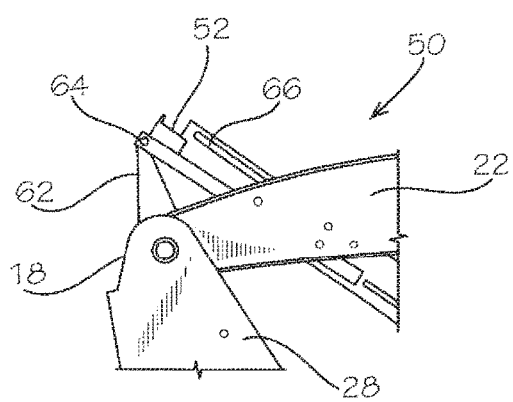
FIG. 4 is an enlarged side view of a portion of the implement of FIG. 1 and the indicator mechanism of the implement of FIG. 2.

Turning now to FIGS. 2 and 3, according to the invention, the loader 12 has a tool level indicator mechanism, generally indicated at 50, configured to provide an indication of the level position of the tool 30 throughout a working range of movement between a lowered position and a raised position. The tool level indicator mechanism 50 comprises a carriage assembly 52 having a carriage frame 54, which in the illustrated embodiment, has a carriage back 56 and first and second carriage endplates 58A, 58B at longitudinal ends of the carriage back 56. A pair of guide rods 60 extends between the carriage endplates 58A, 58B. In the illustrated embodiment, there are two guide rods 60; however, fewer or more guide rods 60 may be used without departing from the scope of the invention. As seen in FIG. 4, a first end of the carriage assembly 52 is pivotably connected to a mounting tab 62 on one of the masts 24 at pivot 64.

Figure 6:
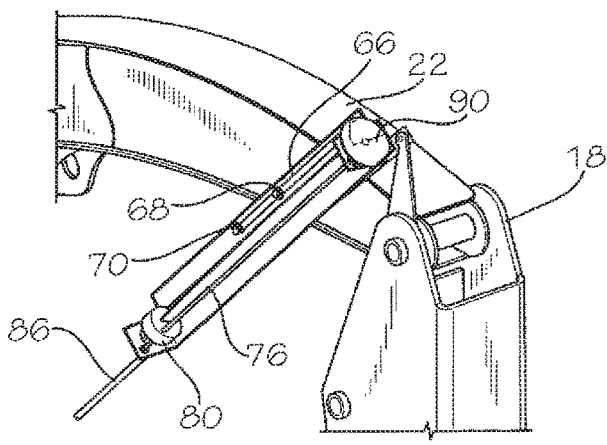
FIG. 6 is an enlarged perspective view of a portion of the implement of FIG. 1 and the indicator mechanism of the implement of FIG. 2.

The carriage back 56 has a slot 66 formed therein along a portion of its longitudinal length. Turning also now to FIG. 6, a boom height compensating link 68 is mounted on the upper arm section 22. The boom height compensating link 68 has at least one fixed traveler 70 configured to be received in the slot 66 in the carriage back. The carriage assembly 52 is mounted to the loader boom 18 in such a way that it can slide relative the traveler 70. As the loader boom 18 is raised and lowered by extension or retraction of the lift actuators 32, the carriage assembly 52 rotates relative the mast 24 about the pivot 64 as the traveler 70 slides in the slot 66 in the carriage back 56.

Figure 5:
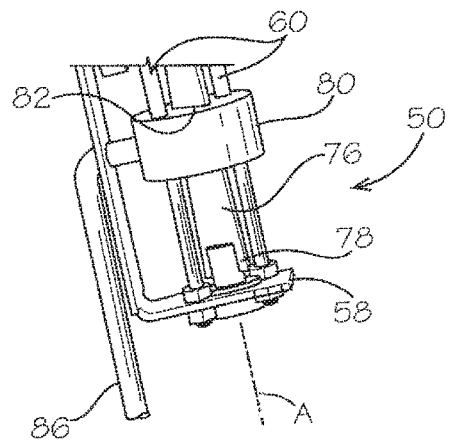
FIG. 5 is an enlarged perspective view of a portion of the indicator mechanism of the implement of FIG. 2.

As best seen in the enlarged view of FIG. 5, the carriage assembly 52 supports a twisted strip 76 extending between the carriage endplates 58. Suitable bearings 78 are used to permit the twisted strip 76 to rotate relative the carriage endplates 58. A sliding indicator nut 80 rides on the guide rods 60 such that it may move along the longitudinal axis of the carriage assembly 52 but is prevented from rotating relative the carriage assembly 52. The indicator nut 80 has a center aperture 82 that receives the twisted strip 76 and permits longitudinal movement of the nut 80 relative the twisted strip 76 along an axis A of the carriage assembly 52, but prevents angular movement of the portion of the twisted strip 76 that engages the nut 80 relative to the nut 80. The nut 80 is driven along the axis A of the carriage assembly 52 by a linkage 86 that is connected relative the bucket 30 such that the nut 80 reflects the level position of the bucket 30. Retraction or extension of the bucket cylinder 40 causes movement of the linkage 86, and thus movement of the indicator nut 80 along the longitudinal axis A of the carriage assembly 52. As the indicator nut 80 moves up and down the carriage assembly 52 on the guide rods 60 as a result of movement of the bucket 30, the orientation of the twisted strip 76 is made to change due to the engagement of the twisted strip 76 with the indicator nut 80.

One end of the twisted strip 76 is connected to an indicator dial 90. The indicator dial 90 converts the orientation of the twisted strip 76 which is indicative of the level position of the bucket 30, into a reading accessible to the operator of the tractor 10. Desirably, the indicator dial 90 presents the position information in a clear graphical representation of the implement 12 near the operator where it's easy to see. One skilled in the art will appreciate that a different indicator dial 90 can be made for different types implements 12 to show the profile of the implement. The carriage assembly 52 could be scaled smaller by adjusting the twist rate of the twisted strip 76 and the compensating linkage design.

As described, the reading of the indicator dial 90 is affected by input from both the linkage 86 connected to the bucket cylinder driving the indicator nut 80 based on the level position of the bucket 30, and also from the height compensating link 68 positioning the carriage assembly 52 based on the position of the boom arm 18. Accordingly, the indicator dial 90 provides a reading that is responsive throughout the working range of motion of the loader boom 18 between its lowered and raised positions. As the loader boom 18 is raised, the carriage slides down the boom effectively moving the nut 80 up in the carriage assembly 52. This adds to the indicated reading provided by the bucket cylinder location input provided by the linkage 86 to provide a depiction of the position of the tool 30 throughout its working range. An additional advantage is the indicator dial 90 provides position information over the entire rotational working range of the tool 30 rather than just at a level position.

Figure 7:
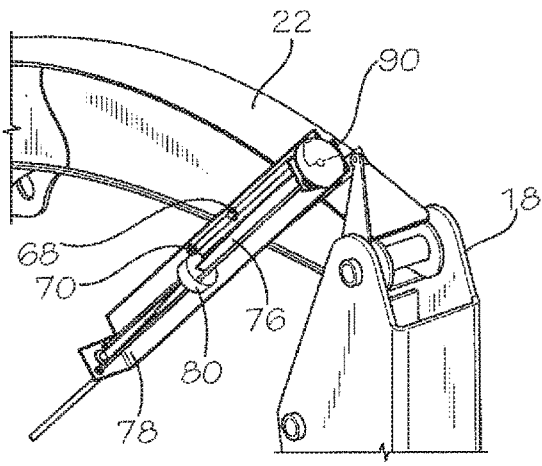
FIG. 7 is an enlarged perspective view of a portion of the implement of FIG. 1 and the indicator mechanism of the implement of FIG. 2.
Figure 8:
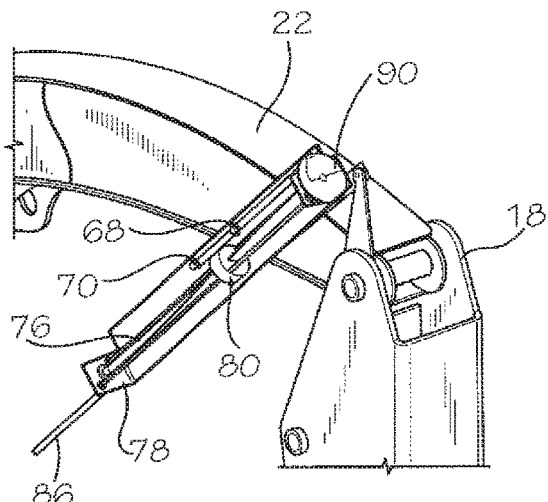
FIG. 8 is an enlarged perspective view of a portion of the implement of FIG. 1 and the indicator mechanism of the implement of FIG. 2.
Figure 9:
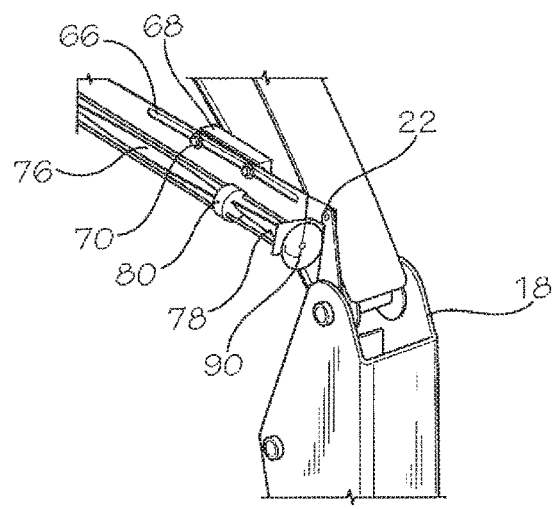
FIG. 9 is an enlarged perspective view of a portion of the implement of FIG. 1 and the indicator mechanism of the implement of FIG. 2.
Figure 10:
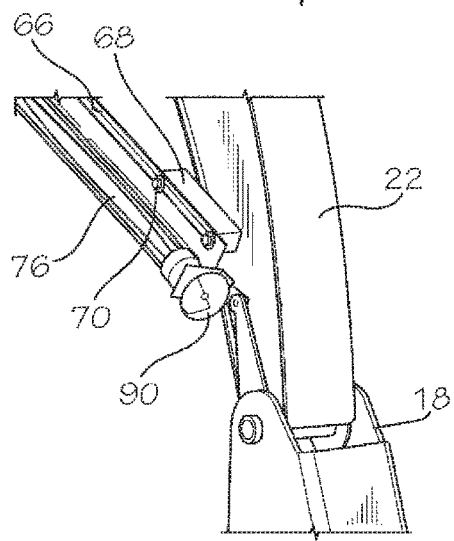
FIG. 10 is an enlarged perspective view of a portion of the implement of FIG. 1 and the indicator mechanism of the implement of FIG. 2.
Figure 11:
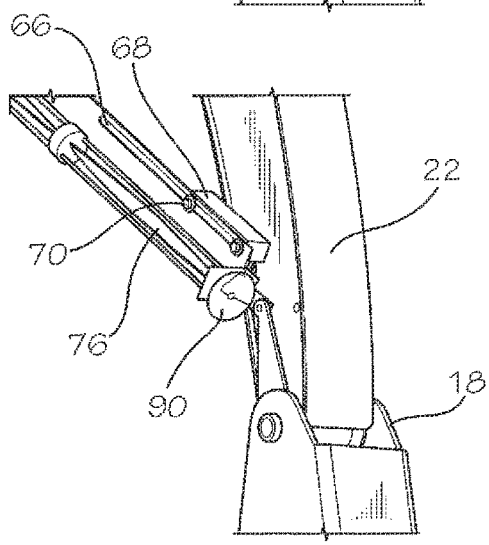
FIG. 11 is an enlarged perspective view of a portion of the implement of FIG. 1 and the indicator mechanism of the implement of FIG. 2.

FIG. 6 illustrates the tool level indicator mechanism 50 with the loader boom 18 down and the bucket cylinder 40 fully extended. FIG. 7 illustrates the tool level indicator mechanism 50 with the loader boom 18 down and the bucket cylinder 40 positioned so that the bucket 30 is level. FIG. 8 illustrates the tool level indicator mechanism 50 with the loader boom 18 down and the bucket cylinder 40 fully retracted. FIG. 9 illustrates the tool level indicator mechanism 50 with the loader boom 18 mid-height and the bucket cylinder 40 fully retracted. FIG. 10 illustrates the tool level indicator mechanism 50 with the loader boom 18 full height and the bucket cylinder 40 fully retracted. FIG. 11 illustrates the tool level indicator mechanism 50 with the loader boom 18 full height and the bucket cylinder 40 fully extended.

Although the illustrated embodiment shows the carriage assembly 52 mounted on the loader boom 18, one skilled in the art will understand that the carriage assembly 52 could be remotely mounted with inputs provided by control cables that receive and transmit the positions of the loader boom 18. While the illustrated embodiment shows a carriage assembly 52 with guide rods 60 extending between the endplates, the carriage assembly 52 could be designed using any suitable guide members that allow the indicator nut 80 to slide along the longitudinal axis of the carriage assembly 52 but prohibit rotation of the nut 80 thereto using sound engineering judgment.

It should be emphasized that the above-described embodiments of the present disclosure are merely possible examples of implementations, merely set forth for a clear understanding of the principles of the disclosure. Many variations and modifications may be made to the above-described embodiment(s) of the disclosure without departing substantially from the spirit and principles of the disclosure. All such modifications and variations are intended to be included herein within the scope of this disclosure and protected by the following claims.

At least the following is claimed:

1. A bucket level indicator mechanism for use with work machine with a front mounted loader implement, the loader implement having a loader boom moveable through a working range of movement between a lowered position and a raised position, wherein the loader boom comprises at least one loader arm and a lift actuator configured to move the loader boom through a working range of movement between a lowered position and a raised position, the at least one loader arm including a forwardly projecting upper arm section with a rear end pivotally mounted to a mast of the work machine and a lower arm section which extends downwardly and forwardly, the lift actuator coupled between the mast of the work machine and a junction between the upper and lower arm sections, the loader implement also having a loader bucket mounted to a distal end of the at least one loader arm with a bucket cylinder, wherein extension and retraction of the bucket cylinder causes the loader bucket to move through a dumping range of movement between a dump position and a rolled back position, the loader implement comprising a bucket level indicator mechanism configured to provide an indication of a level position of the loader bucket in the dumping range between the dump position and the rolled back position throughout the working range of movement of the loader boom, the bucket level indicator mechanism comprising:

a carriage assembly having a carriage frame comprising a carriage back and first and second carriage endplates at longitudinal ends of the carriage back, a first end of the carriage assembly being pivotably connected to the mast of the work machine, wherein the carriage back has a slot formed therein along a portion of a longitudinal axis A of the carriage assembly;

at least one guide rod extending between the first and second carriage endplates;

a boom height compensating link mounted on the loader arm, the boom height compensating link having at least one fixed traveler affixed to the upper arm section of the loader arm and received in the slot in the carriage back, the carriage assembly being mounted so as to slide relative to the boom height compensating link as the at least one fixed traveler slides in the slot, wherein as the loader boom is raised and lowered through the working range of movement between the lowered position and the raised position by extension or retraction of the lift actuator, the carriage assembly rotates relative the mast about a pivot as the at least one fixed traveler slides in the slot in the carriage back;

a twisted strip extending between the first and second carriage endplates supported by the carriage assembly, wherein ends of the twisted strip are configured to rotate relative to the first and second carriage endplates;

a bucket cylinder linkage;

a sliding indicator nut received on the at least one guide rod such that the sliding indicator nut is movable along the longitudinal axis A of the carriage assembly but is prevented from rotating relative to the carriage assembly, wherein the indicator nut has a center aperture that engages the twisted strip and permits longitudinal movement of the sliding indicator nut relative to the twisted strip along the longitudinal axis A of the carriage assembly, wherein movement of the loader bucket through the dumping range of movement between the dump position and the rolled back position causes the bucket cylinder linkage to move the sliding indicator nut along the longitudinal axis A of the carriage assembly on the at least one guide rod causing an orientation of the twisted strip to change due to the engagement of the twisted strip with the sliding indicator nut such that the position of the sliding indicator nut indicates the level position of the loader bucket between the dump position and the rolled back position.

2. The bucket level indicator mechanism of claim 1 wherein there are two guide rods.

3. The bucket level indicator mechanism of claim 1 wherein retraction and extension of the bucket cylinder causes movement of the loader bucket linkage, and thus movement of the sliding indicator nut along the longitudinal axis A of the carriage assembly.

4. The bucket level indicator mechanism of claim 3 further comprising an indicator dial, wherein one end of the twisted strip is connected to the indicator dial.

5. The bucket level indicator mechanism of claim 4 wherein the indicator dial is configured to convert the orientation of the twisted strip indicative of the level position of the bucket, into a position reading accessible to the operator of the work machine.

6. The bucket level indicator mechanism of claim 4 wherein the indicator dial receives input from both the loader bucket linkage connected to the bucket cylinder driving the sliding indicator nut based on the level position of the bucket, and from the height compensating link positioning of the carriage assembly based on the position of the at least one arm.

* * * * *